United States Patent
Pan et al.

[11] Patent Number: 6,143,647
[45] Date of Patent: *Nov. 7, 2000

[54] SILICON-RICH BLOCK COPOLYMERS TO ACHIEVE UNBALANCED VIAS

[75] Inventors: Chuanbin Pan, San Jose; Chien Chiang, Fremont, both of Calif.

[73] Assignee: Intel Corporation, Santa Clara, Calif.

[*] Notice: This patent issued on a continued prosecution application filed under 37 CFR 1.53(d), and is subject to the twenty year patent term provisions of 35 U.S.C. 154(a)(2).

[21] Appl. No.: 08/899,133

[22] Filed: Jul. 24, 1997

[51] Int. Cl.⁷ .................................................. H01L 21/4763
[52] U.S. Cl. ..................... 438/637; 438/638; 438/672; 438/975
[58] Field of Search .................. 438/637, 638, 438/672, 975; 257/746, 774

[56] References Cited

U.S. PATENT DOCUMENTS 4,430,153  2/1984  Gleason et al. ..................... 156/643
5,371,047  12/1994  Greco et al. ....................... 437/238

Primary Examiner—John F. Niebling
Assistant Examiner—David A. Zarneke
Attorney, Agent, or Firm—Blakely, Sokoloff, Taylor & Zafman LLP

[57] ABSTRACT

An integrated circuit and method for making it is described. The integrated circuit includes an insulating layer, formed within a trench that separates conductive elements of a conductive layer, that has a low dielectric constant. The insulating layer is convertible at least in part into a layer that is resistant to a plasma that may be used for a photoresist ashing step or to a solvent that may be used for a via clean step. Preferably the insulating layer comprises a silicon containing block copolymer that is convertible at least in part into a silicon dioxide layer. The silicon dioxide layer protects the remainder of the insulating layer from subsequent processing, such as photoresist ashing and via clean steps.

11 Claims, 5 Drawing Sheets

SILICON-RICH BLOCK COPOLYMERS TO ACHIEVE UNBALANCED VIAS

FIELD OF THE INVENTION

The present invention relates to integrated circuits and a method for making them.

BACKGROUND OF THE INVENTION

Integrated circuits are made by forming one or more layers of conductive material on a substrate, such as silicon. When more than one layer of conductive material is used, those layers are separated by a layer or layers of insulating material. Vias may be etched through the insulating layers, which can be filled with a conducting material to form an electrical connection between the separated conductive layers.

A commonly used insulating material is silicon dioxide. Although a thermally stable and mechanically strong material, silicon dioxide has a relatively high dielectric constant of about 4. The relatively high capacitance associated with forming a silicon dioxide layer between a conductive layer's conductive elements may cause undesirable cross talk and RC delay—especially in devices that include narrow trenches to separate the conductive elements.

As described in U.S. Pat. No. 5,886,410 (assigned to this application's assignee), certain materials that have a dielectric constant which is lower than silicon dioxide's may be used as insulating materials. Such materials can be used to fill the trenches that separate conductive elements. Although such materials can improve certain interconnect characteristics, they may be consumed when exposed to certain solvents or plasmas. Consequently, although such materials should work well for landed vias, they may not be used with unbalanced, i.e., unlanded, vias when exposed to $O_2$ containing plasma or certain solvents during via clean and photoresist ashing steps.

Because it may be desirable to allow for the use of unlanded vias, especially when making integrated circuits having very thin metal lines, there is a need for an integrated circuit that includes a dielectric material having a low dielectric constant that will not erode or dissolve during photoresist removal or via clean steps.

There is likewise a need for a process for making semiconductors that include unlanded vias that uses a dielectric layer having a low dielectric constant, which will not be consumed during the photoresist removal and via clean steps.

SUMMARY OF THE INVENTION

An improved integrated circuit and method for making it are described. The integrated circuit includes a conductive layer that is formed on a substrate and that has conductive elements separated by a trench, and an insulating layer formed within the trench. The insulating layer has a low dielectric constant and is convertible at least in part into a layer that is resistant to a plasma that may be used for a photoresist ashing step or to a solvent that may be used for a via clean step. The low dielectric constant insulating layer may include a silicon containing block copolymer.

In a preferred embodiment of the present invention, the claimed integrated circuit may be made by forming on a substrate a first conductive layer having conductive elements separated by a trench, then forming an insulating layer within the trench that comprises a silicon containing block copolymer. After forming the insulating layer, a first layer of silicon dioxide may be formed on top of it followed by patterning a photoresist layer over that silicon dioxide layer to define a via formation region. After etching a via, defined by that region, that extends from the surface of the silicon dioxide layer to the first conductive layer, the photoresist layer is removed. Removal of the photoresist layer converts at least part of the insulating layer into a second silicon dioxide layer. The second silicon dioxide layer protects the remaining portion of the insulating layer from the photoresist removal step. After removing the photoresist layer, a conductive plug may be formed that fills the via etched through the first silicon dioxide layer. Finally, a second conductive layer may be formed on top of the first silicon dioxide layer that is connected to the first conductive layer with the conductive plug.

DETAILED DESCRIPTION OF THE PRESENT INVENTION

Figure 1:
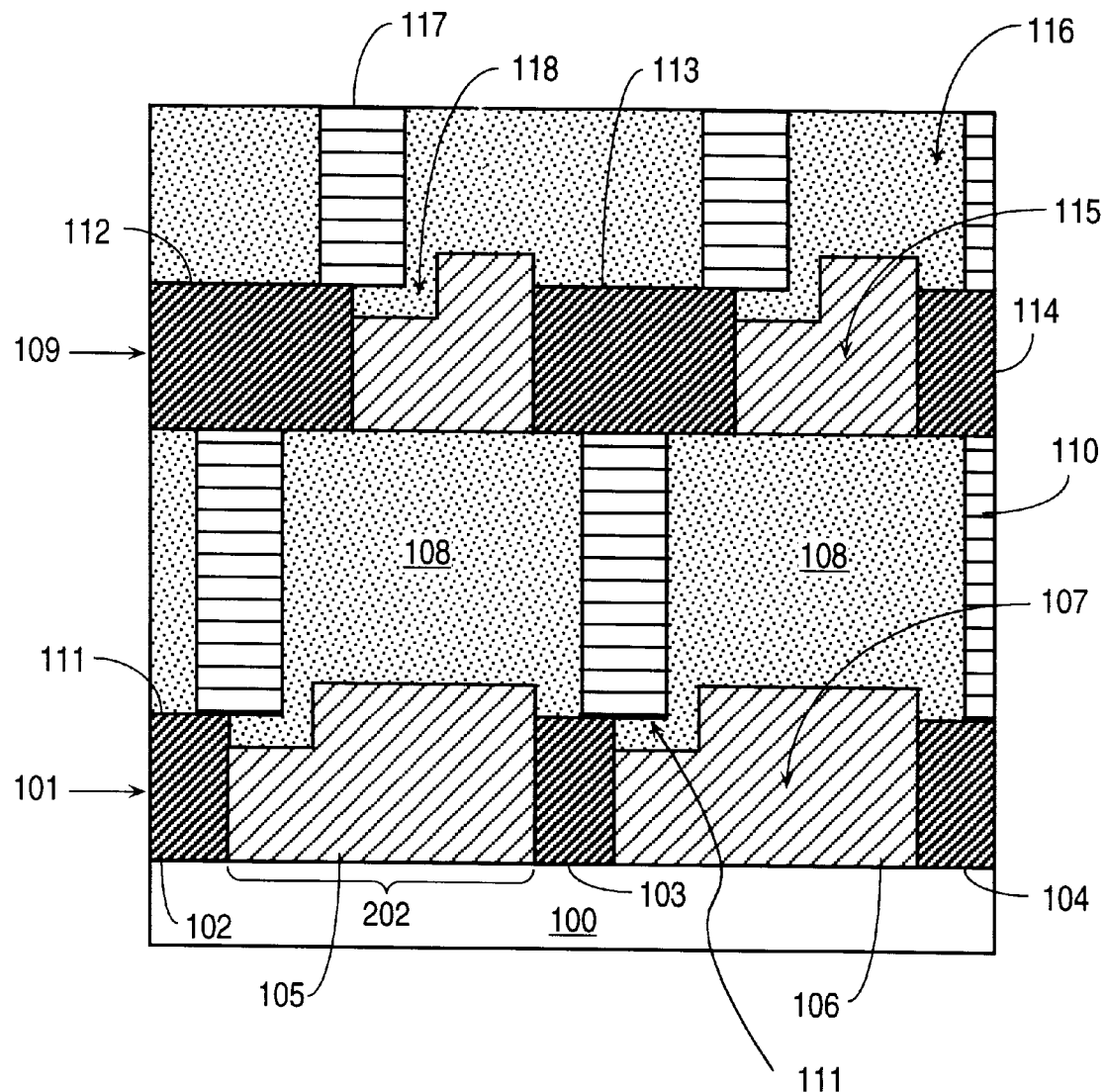
FIG. 1 is a cross-sectional illustration of an embodiment of the integrated circuit of the present invention.

An improved integrated circuit and method for making it are described. FIG. 1 is a cross-sectional illustration of an embodiment of the integrated circuit of the present invention that includes a substrate 100 upon which is formed a conductive layer 101 that includes conductive elements 102, 103, and 104. Conductive elements 102, 103 and 104 are separated by trenches 105 and 106, which have a width 202.

Substrate 100 may be any surface, used when making an integrated circuit, upon which a conductive layer may be formed. Substrate 100 thus may include, for example, active and passive devices that are formed on a silicon wafer such as transistors, capacitors, resistors, diffused junctions, gate electrodes, local interconnects, etc. . . . Substrate 100 also may include insulating materials (e.g., silicon dioxide, either undoped or doped with phosphorus (PSG) or boron and phosphorus (BPSG); silicon nitride; or silicon oxi-nitride) that separate such active and passive devices from the conductive layer or layers that are formed on top of them, and may include previously formed conductive layers.

Conductive layer 101 may be made from materials conventionally used to form conductive layers for integrated circuits. For example, conductive layer 101 may be made from aluminum or an aluminum alloy, such as an aluminum/copper alloy. Alternatively, conductive layer 101 may be made from doped polysilicon or a silicide, e.g., tungsten or titanium silicide.

Conductive layer 101 may include a number of separate layers. For example, a relatively thin titanium layer (preferably having a thickness of about 200 Å or less) may be formed between substrate 100 and the primary conductor, e.g., an aluminum/copper alloy. Another titanium layer (again, preferably having a thickness of about 200 Å or less) may be formed on top of the alloy. A titanium nitride layer, of about the same thickness as the underlying titanium layer, may then be formed on top of the titanium layer. (Such a titanium nitride layer may act as an anti-reflective coating, which may reduce reflection of light from the surface of the metal during the photoresist exposure step that precedes etching of the metal layer.)

Although a few examples of the types of materials that may form conductive layer 101 have been identified here, conductive layer 101 may be formed from various other materials that can serve to conduct electricity within an integrated circuit. The use of any such conducting material falls within the spirit and scope of the present invention.

When included in a process designed to yield a high packing density, width 202 of trenches 105 and 106 may be less than about 0.18 micron. Although trenches 105 and 106 are shown in FIG. 1 as having vertical sidewalls, the presence of any interstitial space of any form, shape or dimension located between the conductive elements falls within the scope of the present invention.

As shown in FIG. 1, an insulating layer 107 is formed within trenches 105 and 106. Insulating layer 107 has a low dielectric constant, preferably less than about 3.5, more preferably between about 1.8 and about 3.0, and most preferably between about 2.5 and about 2.8. Because of layer 107's low dielectric constant, the capacitance between conductive elements 102 and 103 and between conductive elements 103 and 104 should be reduced, when compared to the capacitance resulting from use of other conventionally used dielectric materials such as silicon dioxide. Such reduced capacitance may decrease the RC delay that would otherwise exist and also decrease undesirable cross-talk between conductive lines. In addition, the lower capacitance may reduce power dissipation. When high temperatures, which may exceed 400° C., follow the formation of insulating layer 107, that layer must be made of a material that will remain stable when subjected to such temperatures.

Insulating layer 107 is convertible at least in part into a layer that is resistant to plasmas that may be used for a photoresist ashing step and to solvents that may be used in a via clean step. A preferred material for making such an insulating layer includes silicon that is contained in a block or random copolymer. Most preferred are materials that have silicon containing blocks distributed within an organic polymer. Such organic polymers include, for example, polyimides, parylenes, polyarylethers, polynaphthalenes, and polyquinolines, or copolymers thereof.

The silicon containing blocks may include silicon embedded in a polyarylether or other organic polymer or copolymer; fluorinated silicon dioxide ($SiO_xF_y$), where the fluorine content is preferably less than about 10% by weight; hexagonal boron nitride; porous silicon dioxide; $H_xSiO_y$, preferably having greater than 2% by weight hydrogen, such as hydrogen silsesquioxane for example; or $CH_3SiO_{1.5}$, an organic spin on glass. Preferably, the silicon containing blocks should be uniformly distributed within the organic polymer or copolymer without silation having occurred. The percentage of organic polymer included in layer 107 should exceed 5% by weight, and preferably should be between about 70 and 95% by weight, i.e., the silicon containing block preferably should comprise between about 5% and 30% by weight.

The most preferred material for insulating layer 107 includes a silicon containing polymer combined with a polyarylether, where the resulting block copolymer has a dielectric constant of less than about 2.8. The etch selectivity between such a block copolymer and silicon dioxide preferably should be close to 1:1, when fluorocarbon chemistry is used for the silicon dioxide etch.

The presence of the silicon containing blocks within the block copolymer enables this preferred material to form a self-passivating silicon dioxide layer, when exposed to an oxygen containing plasma. Such exposure may occur during the photoresist ashing step that follows the etching of vias through a layer formed on top of insulating layer 107, as described below.

Although several examples of materials that can be used to make the convertible low dielectric constant insulating layer 107 have been identified here, any insulating layer having a low dielectric constant, which can be converted at least in part into a layer that is resistant to steps used to ash photoresist or clean vias, is within the spirit and scope of the present invention.

Above insulating layer 107 is second insulating layer 108. Second insulating layer 108 serves to separate conductive layer 101 from second conductive layer 109. Second insulating layer 108 preferably is made from a thermally stable and mechanically strong material that is resistant to solvents, plasmas, slurries, moisture, etc. . . . that may contact second insulating layer 108 when etching and cleaning vias, when removing photoresist, or when using chemical-mechanical polishing ("CMP") to remove certain materials (e.g., tungsten). Preferred materials for second conducting layer 108 are silicon dioxide or a silicon dioxide/silicon nitride dual layer, although any material having the properties specified above falls within the spirit and scope of the present invention.

Plugs 110 are shown connecting conductive layer 101 with second conductive layer 109. In the embodiment shown in FIG. 1, plugs 110 were formed in unlanded vias, i.e., unbalanced vias that did not line up precisely with conductive elements 102, 103, and 104. The method of the present invention, which will be described below, permits such a structure because insulating layer 107 is convertible at least in part into a layer that is resistant to plasmas and/or solvents that may be used in the photoresist ashing and/or via clean steps that follow the via etching step. Consequently, even though the vias for plugs 110 are unlanded, the solvents and/or plasmas used in subsequent photoresist removal and/or via clean steps do not consume a significant portion of insulating layer 107. Rather, as shown in FIG. 1, a part of insulating layer 107 is converted into a third insulating layer 111 that is resistant to such solvents and/or plasmas. The formation of third insulating layer 111 provides a self-passivating layer located between the unlanded vias and insulating layer 107, which protects insulating layer 107 from further erosion.

Plugs 110 may be made from any type of conductive material that may be used to connect separate conductive layers. Although plugs 110 are preferably made from tungsten, they may also be made from aluminum or an aluminum containing alloy, e.g., an aluminum/copper alloy. When tungsten is used for plugs 110, a dual layer of titanium and titanium nitride may be formed between second insulating layer 108 and the tungsten plug 110 to help the tungsten adhere to second insulating layer 108.

Above second insulating layer 108 and plugs 110 is second conductive layer 109. Conductive layer 109 (which may be made from the same material used to make conductive layer 101) includes conductive elements 112, 113 and 114. These conductive elements are separated by insulating layer 115 (preferably made from the same material used to make insulating layer 107) and are covered by insulating layer 116 (preferably made from the same material used to make second insulating layer 108). Also shown are additional plugs 117 and insulating layer 118 (formed from part of insulating layer 115 during a subsequent photoresist ashing or via cleaning step).

Plugs 110 and second conductive layer 109 may be made from the same material. Under such circumstances, it may be possible to form both plugs 110 and conductive layer 109 with a single deposition step followed by an etch step. The number of conductive and insulating layers included in the resulting integrated circuit may of course vary, as is well known to those skilled in the art.

Set forth below is a description of a preferred process for making the integrated circuit described above. That description is made with reference to FIGS. 2a–2i, which provide cross-sectional illustrations that reflect the structures that result after using certain steps.

Figure 2A:
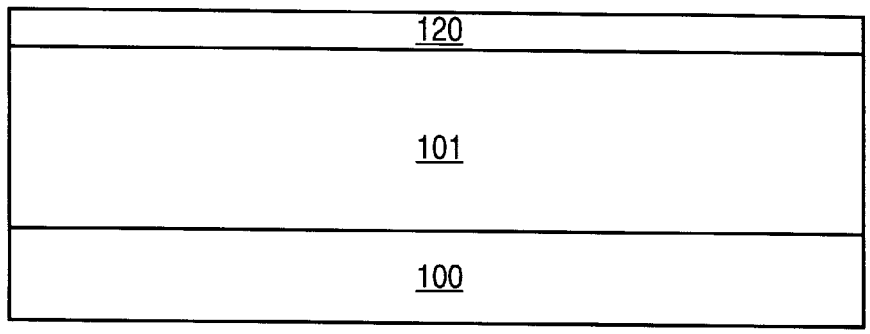
FIGS. 2a–2i are cross-sectional illustrations that reflect structures that may result after certain steps are used, when making the integrated circuit of FIG. 1.

First, a substrate 100 is provided, which may already include many of the myriad of devices, materials and structures used to form integrated circuits. Conductive layer 101 is then formed on substrate 100. Conductive layer 101 may be formed by a chemical vapor or physical deposition process, such as those that are well known to those skilled in the art. After forming conductive layer 101 on substrate 100, an additional layer 120 may be formed on conductive layer 101, which will serve as a stop layer for a subsequent CMP step. CMP stop layer 120 preferably is made from silicon dioxide, but may be made from other types of materials that can serve that function as is well known to those skilled in the art. When formed from silicon dioxide, a chemical vapor deposition process may be used to form stop layer 120. When initially formed, CMP stop layer 120 preferably has a thickness of between about 2,000 and 3,000 Å. FIG. 2a provides a cross-sectional illustration of the structure that results after conductive layer 101 and CMP stop layer 120 have been formed on substrate 100.

Figure 2B:
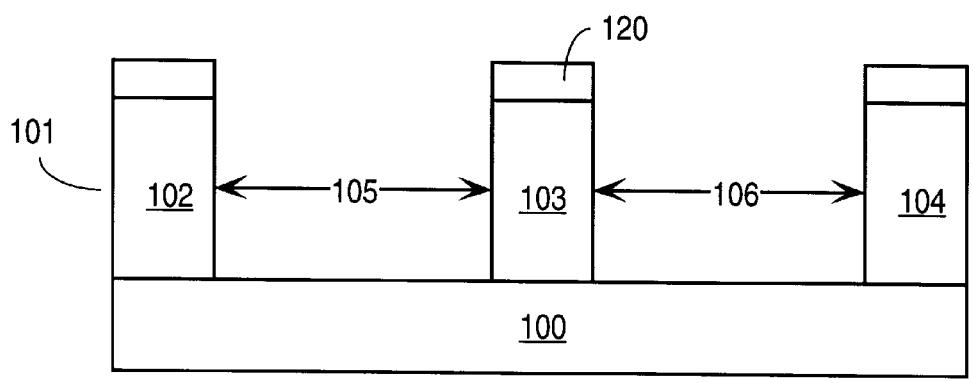
Figure 2C:
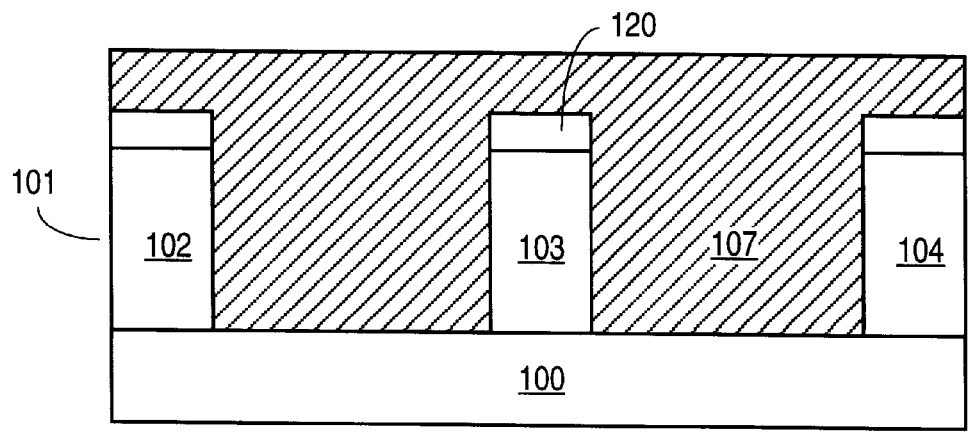

Conductive layer 101 and layer 120 are then etched to form conductive elements 102, 103 and 104 using conventional photolithographic and etching techniques, such as applying a plasma etch using a $BCl_3$ and $Cl_2$ containing plasma. As shown in FIG. 2b, an etched portion of layer 120 remains on top of each of the conductive elements. Note that trenches 105 and 106 separate conductive elements 102 and 103, and conductive elements 103 and 104, respectively.

Next, insulating layer 107 is formed on top of the etched conductive layer 101 and CMP stop layer 120, preferably by either spin coating or by chemical vapor deposition. In the embodiment shown in FIG. 2c, insulating layer 107 completely fills trenches 105 and 106. However, forming insulating layer 107 within trenches 105 and 106 such that it only partially fills these trenches falls within the spirit and scope of the present invention.

As described above, insulating layer 107 preferably includes a silicon containing block copolymer—most preferably a block copolymer that includes a silicon containing block uniformly distributed within an organic polymer or copolymer. It may be desirable to cure insulating layer 107, such as by applying heat at between about 100 to 400° C. for less than 30 minutes.

Figure 2D:
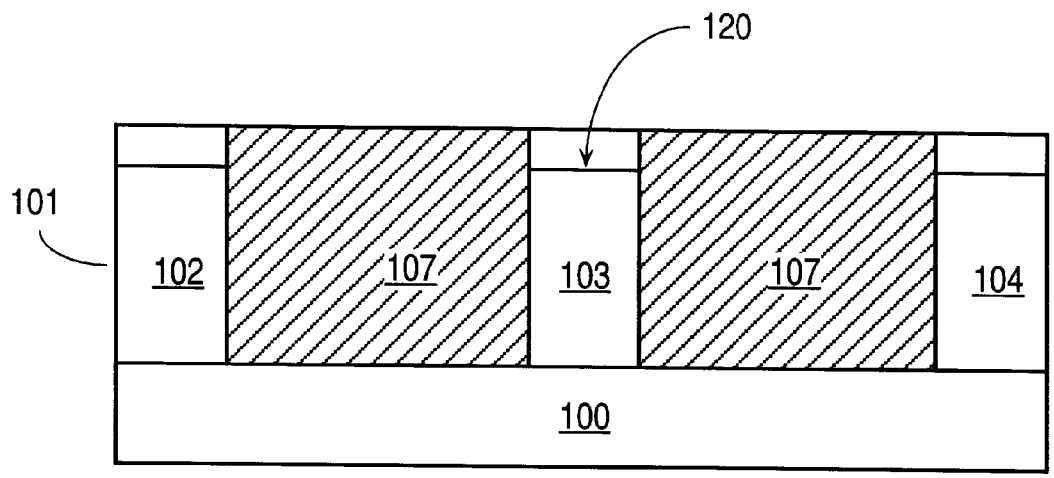

A top portion of insulating layer 107 is preferably removed, such as by using a conventional CMP step. When using such a CMP step to remove the portions of insulating layer 107 that extend above CMP stop layer 120, the resulting structure appears as shown in FIG. 2d. The CMP step planarizes the surface of insulating layer 107 permitting the subsequently formed second insulating layer to be deposited onto a relatively flat surface. Alternatively, portions of insulating layer 107 may be etched back instead, which may not planarize the surface as well as a CMP step.

Figure 2E:
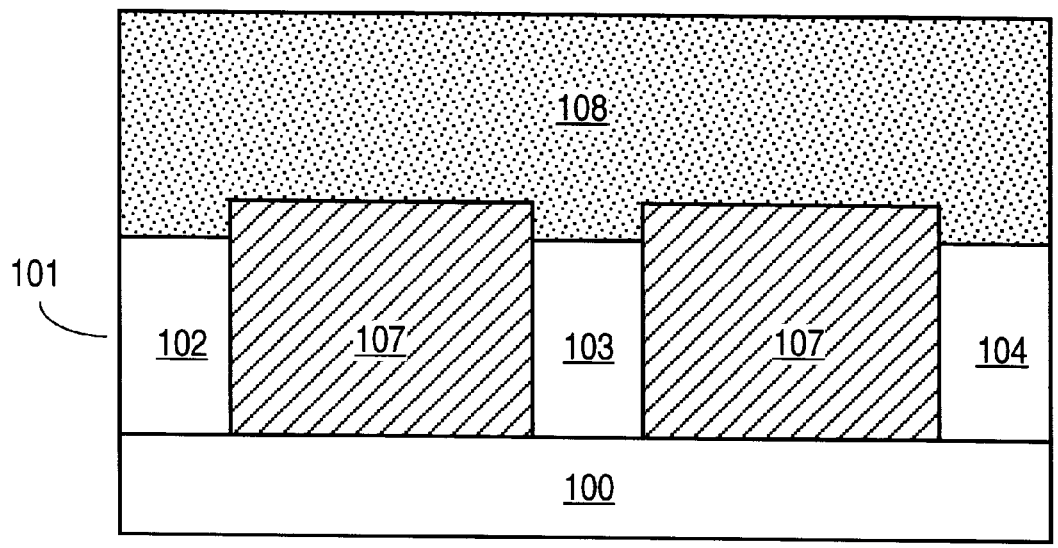

After forming and planarizing insulating layer 107, a second insulating layer 108 is formed on top of it, preferably by chemical vapor deposition. As mentioned above, the preferred material for second insulating layer 108 is silicon dioxide. After second insulating layer 108 is formed on top of insulating layer 107, it is either etched back or planarized using a conventional CMP step. The resulting structure is shown in FIG. 2e, which reflects a process where both stop layer 120 and second insulating layer 108 are made from silicon dioxide—hence, the figure does not include a line to illustrate any separation between these two layers.

Figure 2F:
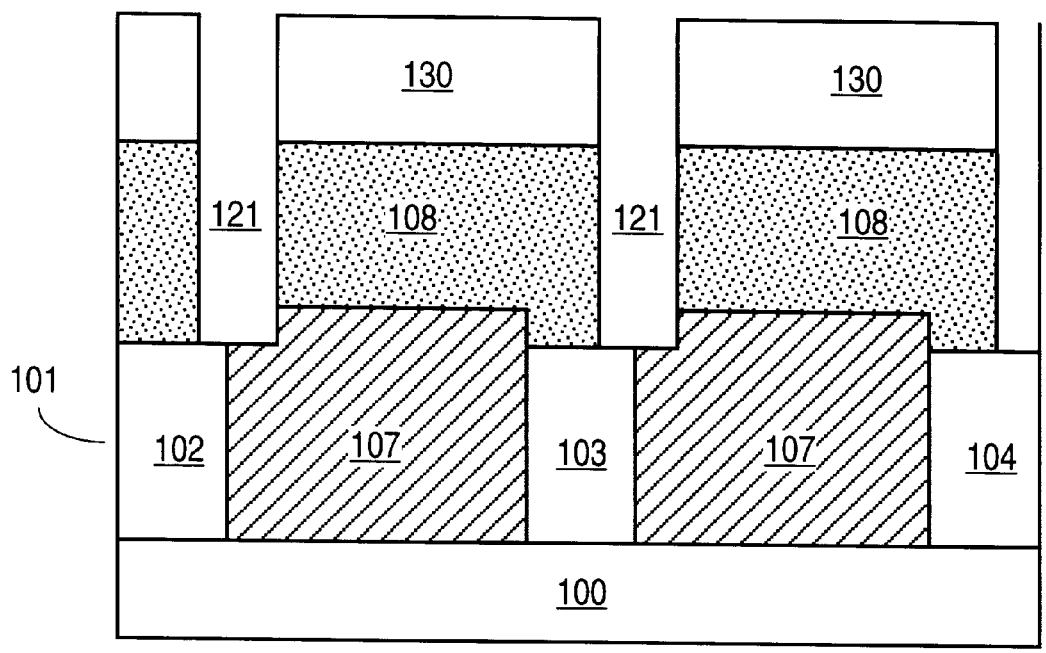

Next, a photoresist layer 130 is patterned on top of second insulating layer 108 to define a via formation region intended to allow for alignment of subsequently formed vias with conductive elements 102, 103 and 104 to the extent feasible. Photoresist layer 130 is patterned using conventional photolithographic techniques, such as masking the layer of photoresist, exposing the masked layer to light, then developing the unexposed portions. Vias 121 are then etched that extend from the surface of second insulating layer 108 to conducting layer 101. As shown in FIG. 2f, vias 121 are unlanded, i.e., they do not line up perfectly with the conductive elements, but instead extend onto insulating layer 107.

A single wafer, low-frequency, parallel-plate etcher, maintained at a low enough temperature to prevent photoresist reticulation, may be used to etch unlanded vias 121. Conventional etchants may be used including, for example, those based on fluorocarbon materials like $CF_4$, $CHF_3$, and $C_2F_6$. The active etchant further may include a dilutant such as argon or helium and trace amounts of nitrogen or carbon dioxide.

When a block copolymer that includes a silicon containing polymer and an organic polymer is used for insulating layer 107, and silicon dioxide is used for second insulating layer 108, the etch selectivity between these two materials should be close to 1:1—if the active substance used in the plasma etch is based on fluorocarbon chemistry. Note that in the embodiment shown in FIG. 2f, a small section of insulating layer 107 is shown to have been etched away.

After unlanded vias 121 have been etched, photoresist layer 130 is then ashed, preferably by using an $O_2$ and $N_2$ containing plasma. An ethylene glycol dip may follow. The solution used for that dip may include hydrogen fluoride and/or aluminum fluoride. Such an ethylene glycol dip should remove residual polymer, if any, from the sidewalls of vias 121. That step may be followed by conventional rinsing and drying steps.

When a metal stack is used for conductive layer 101, such as a Ti/Al—Cu/Ti/TiN stack as mentioned above, such a cleaning step can isotropically etch the Al—Cu layer. Such an etch step of conductive elements 102, 103 and 104 may form a void for receiving the subsequently deposited plugs, which may help anchor the plugs to the conductive elements. When such a clean step is used to form such a void, the via etch step must etch through the cap layers to expose the bulk Al—Cu layer to the clean chemicals.

Figure 2G:
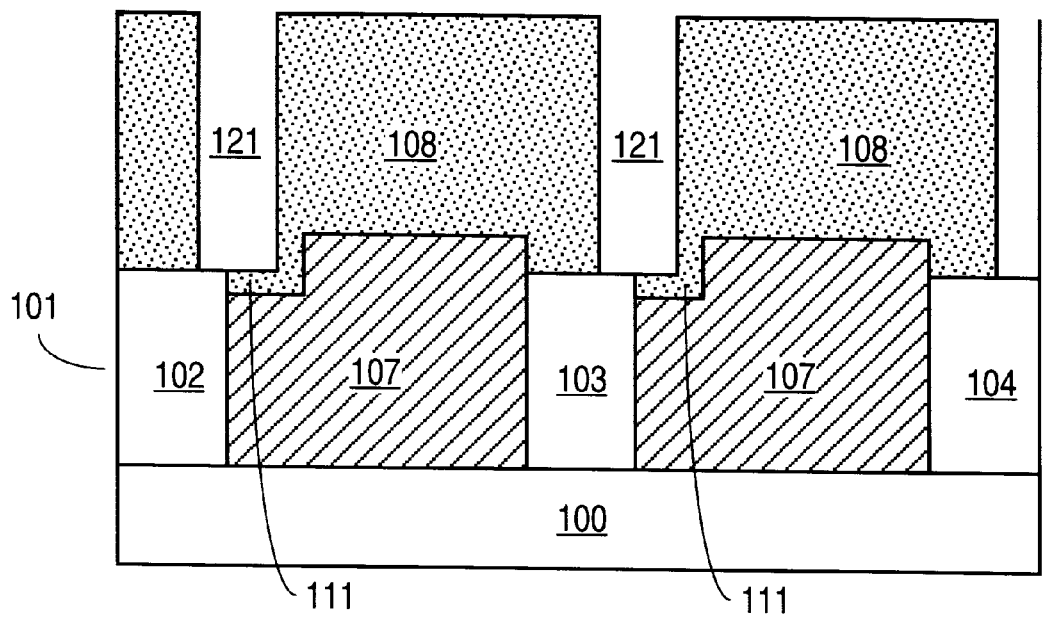

In a preferred embodiment of the present invention, insulating layer 107 includes a silicon containing block copolymer which is exposed to an $O_2$ containing plasma during the photoresist ashing step. During that step, silicon contained in insulating layer 107 reacts with $O_2$ to form a third insulating layer—here, a second silicon dioxide layer—that is resistant to the plasma used for the photoresist ashing step and the subsequent cleaning step. FIG. 2g shows the structure that results when silicon contained in insulating layer 107 reacts with $O_2$ to form second silicon dioxide layer 111. Second silicon dioxide layer 111 acts as a passivation layer that prevents further exposure of insulation layer 107 to the $O_2$ containing plasma.

This particular embodiment describes using a silicon block copolymer for insulating layer 107 and an $O_2$ containing plasma to ash photoresist layer 130, which forms silicon dioxide layer 111. However, processes that use materials other than a silicon block copolymer for insulating layer 107 are within the spirit and scope of the present invention if convertible at least in part into a layer that is resistant to a plasma that may be used for a photoresist ashing step or to a solvent that may be used for a via clean step. Similarly, processes that use plasmas or solvents different from those described above, and processes where third insulating layer 111 is formed from a material other than silicon dioxide, fall within the spirit and scope of the present invention.

After vias 121 are etched and cleaned, a layer of tungsten or another conventionally used conductive layer, is formed on top of second insulating layer 108. In addition to coating insulating layer 108, that conductive layer fills vias 121 forming plugs 110. To help plugs 110 stick to layer 108, a Ti/TiN adhesion layer may be deposited onto insulating layer 108 prior to forming the tungsten layer. The tungsten layer is preferably blanket deposited onto insulating layer 108 and into vias 121 using chemical vapor deposition, which is well known to those skilled in the art.

Figure 2H:
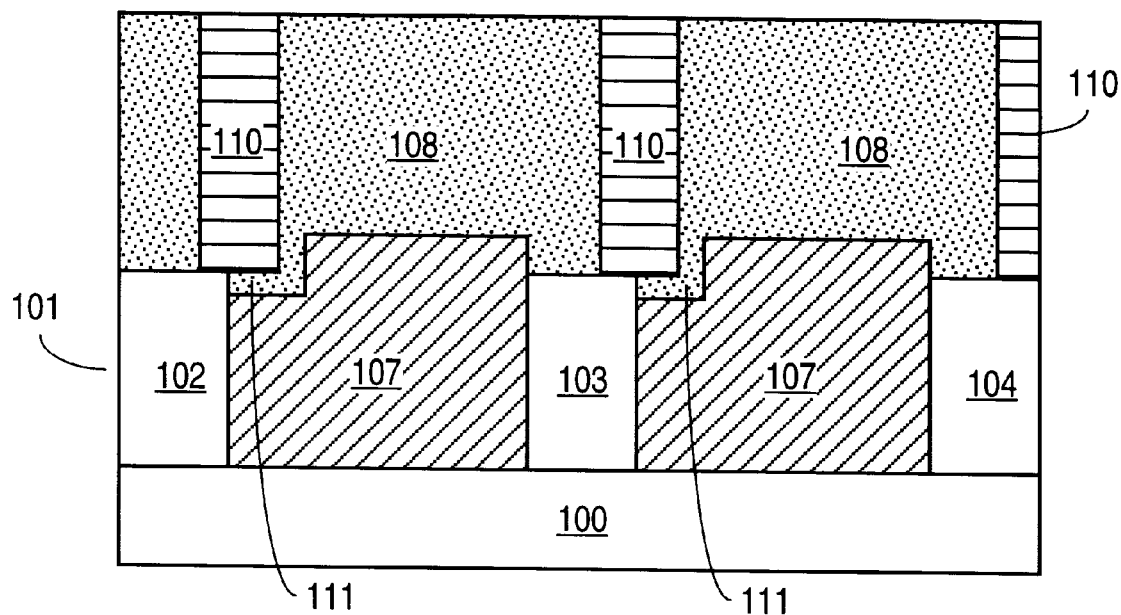

Following the tungsten blanket deposition, a CMP step may be applied to the tungsten layer to remove tungsten from the top of insulating layer 108 and to planarize the surface of plugs 110. The slurry used for this tungsten CMP step may include silica or aluminum mixed with an oxidizer. Insulating layer 108 provides a CMP stop layer for the tungsten CMP step. FIG. 2h shows the structure that results after depositing the tungsten layer then applying the CMP step to produce plugs 110. As an alternative to a CMP step to remove the excess tungsten from the top of insulating layer 108, an etch back process may be used.

Figure 2I:
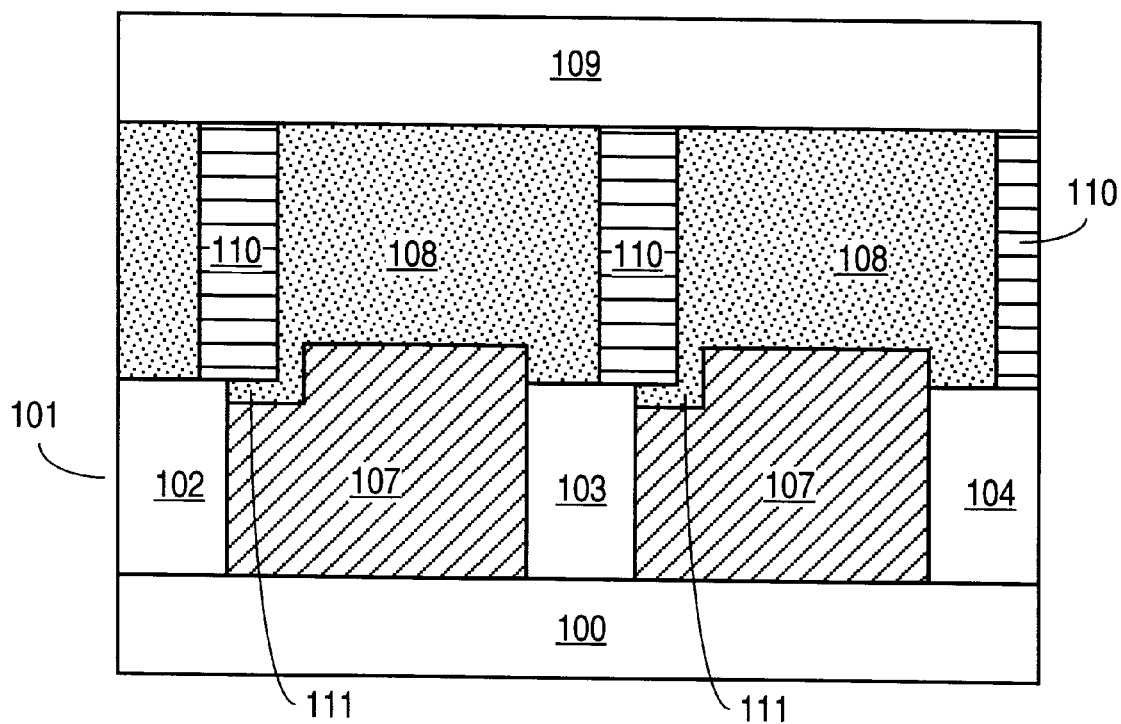

Following the tungsten CMP step, a second conductive layer 109 is deposited on top of insulating layer 108. Second conductive layer 109 is electrically connected to conductive layer 101 with plugs 110, as shown in FIG. 2i. Repeating the CMP stop layer deposition, metal etching, insulating layer deposition, insulating layer CMP, second insulating layer deposition and CMP, and plug formation steps described above after conductive layer 109 is deposited produces the structure shown in FIG. 1. This process may be repeated to form additional conductive and insulating layers until the desired integrated circuit is produced.

The integrated circuit of the present invention, and method for making it, includes a dielectric material that has a low dielectric constant, which allows for the use of unlanded vias. Although the foregoing description has specified certain steps, materials, and equipment that may be used to make such an integrated circuit, those skilled in the art will appreciate that many modifications and substitutions may be made. Accordingly, it is intended that all such modifications, alterations, substitutions and additions be considered to fall within the spirit and scope of the invention as defined by the appended claims.

What is claimed is:

1. A method of forming an integrated circuit comprising:
   forming on a substrate a conductive layer that has conductive elements separated by a trench;
   forming a first insulating layer within the trench that has a low dielectric constant and that is convertible at least in part into a layer that is resistant to a plasma that may be used for a photoresist ashing step or to a solvent that may be used for a via clean step;
   forming a second insulating layer on top of the first insulating layer; and
   etching an unlanded via through the second insulating layer.

2. The method of claim 1 wherein the first insulating layer comprises a polymer.

3. The method of claim 2 wherein the first insulating layer includes a silicon containing block.

4. The method of claim 3 wherein the silicon containing block comprises a material selected from the group consisting of silicon embedded in an organic polymer or copolymer; fluorinated silicon dioxide ($SiO_xF_y$); hexagonal boron nitride; porous silicon dioxide; $H_xSiO_y$; and $CH_3SiO_{1.5}$; and the polymer comprises an organic polymer selected from the group consisting of polyimides, parylenes, polyarylethers, polynaphthalenes, and polyquinolines, or copolymers thereof.

5. The method of claim 1 further comprising converting at least part of the first insulating layer into a third insulating layer that is resistant to a plasma used for a photoresist ashing step or to a solvent used for a via clean step.

6. The method of claim 5 wherein the dielectric constant of the first insulating layer is less than about 3.5 and wherein the dielectric constant of the third insulating layer is greater than about 3.5.

7. The method of claim 6 wherein the dielectric constant of the first insulating layer is between about 1.8 and about 3.0.

8. A method of forming an integrated circuit comprising:
   forming on a substrate a first conductive layer having conductive elements separated by a trench;
   forming a first insulating layer within the trench that has a low dielectric constant and that is convertible at least in part into a layer that is resistant to a plasma that may be used for a photoresist ashing step or to a solvent that may be used for a via clean step;
   forming a second insulating layer on top of the first insulating layer;
   patterning a photoresist layer over the second insulating layer to define a via formation region;
   etching an unlanded via, defined by the via formation region, that extends from the surface of the second insulating layer to the first conductive layer;
   removing the photoresist layer to convert at least part of the first insulating layer into a third insulating layer that is resistant to a plasma used for the photoresist ashing step or to a solvent used for a via clean step, the third insulating layer protecting the remaining portion of the first insulating layer from the photoresist removal step;
   forming a conductive plug that fills the unlanded via etched through the second insulating layer; and
   forming a second conductive layer on top of the second insulating layer that is connected to the first conductive layer with the conductive plug.

9. The method of claim 8 wherein:
   the first insulating layer comprises a silicon containing block that includes a material selected from the group consisting of silicon embedded in an organic polymer or copolymer; fluorinated silicon dioxide ($SiO_xF_y$); hexagonal boron nitride; porous silicon dioxide; $H_xSiO_y$; and $CH_3SiO_{1.5}$;
   the first insulating layer further comprises an organic polymer selected from the group consisting of polyimides, parylenes, polyarylethers, polynaphthalenes, and polyquinolines, or copolymers thereof;
   the second insulating layer is made of silicon dioxide; and the third insulating layer is silicon dioxide made by removing the photoresist layer using an oxygen containing plasma.

10. A method of forming an integrated circuit comprising:

forming on a substrate a first conductive layer having conductive elements separated by a trench;

forming an insulating layer within the trench that comprises a silicon containing block copolymer;

forming a first layer of silicon dioxide on top of the insulating layer;

patterning a photoresist layer over the first silicon dioxide layer to define a via formation region;

etching an unlanded via, defined by the via formation region, that extends from the surface of the first silicon dioxide layer to the first conductive layer;

removing the photoresist layer converting at least part of the insulating layer into a second silicon dioxide layer, the second silicon dioxide layer protecting the remaining portion of the insulating layer from the photoresist removal step;

forming a conductive plug that fills the unlanded via etched through the first silicon dioxide layer; and forming a second conductive layer on top of the first silicon dioxide layer that is connected to the first conductive layer with the conductive plug.

11. The method of claim 10 wherein the silicon containing block copolymer has a dielectric constant of less than about 3.5.

* * * * *